(12) United States Patent
Rogalli et al.

(10) Patent No.: US 10,103,123 B2
(45) Date of Patent: Oct. 16, 2018

(54) SEMICONDUCTOR DEVICES AND PROCESSING METHODS (71) Applicant: Infineon Technologies AG, Neubiberg (DE)

(72) Inventors: Michael Rogalli, Rottenburg (DE); Wolfgang Lehnert, Lintach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/455,158

(22) Filed: Mar. 10, 2017

(65) Prior Publication Data

US 2017/0236801 A1 Aug. 17, 2017

Related U.S. Application Data

(62) Division of application No. 13/656,777, filed on Oct. 22, 2012, now abandoned.

(51) Int. Cl.
*H01L 21/762* (2006.01)
*H01L 23/00* (2006.01)

(52) U.S. Cl.
CPC .............. *H01L 24/85* (2013.01); *H01L 24/03* (2013.01); *H01L 24/05* (2013.01); *H01L 24/45* (2013.01); *H01L 2224/0221* (2013.01); *H01L 2224/02206* (2013.01); *H01L 2224/02215* (2013.01); *H01L 2224/0391* (2013.01); *H01L 2224/04042* (2013.01); *H01L 2224/05111* (2013.01); *H01L 2224/05124* (2013.01); *H01L 2224/05139* (2013.01); *H01L 2224/05147* (2013.01); *H01L 2224/05164* (2013.01); *H01L 2224/05184* (2013.01); *H01L 2224/4502* (2013.01); *H01L 2224/45147* (2013.01); *H01L 2224/85007* (2013.01); *H01L 2224/85238* (2013.01); *H01L 2924/059* (2013.01); *H01L 2924/05042* (2013.01); *H01L 2924/05432* (2013.01); *H01L 2924/05442* (2013.01); *H01L 2924/0665* (2013.01); *H01L 2924/07025* (2013.01)

(58) Field of Classification Search
CPC ......... H01L 24/05; H01L 24/03; H01L 24/48; H01L 24/65; H01L 24/45; H01L 24/02; H01L 24/10; H01L 21/76834; H01L 23/485; H01L 2224/73265; H01L 2924/1815; H01L 2024/00
See application file for complete search history.

(56) References Cited

U.S. PATENT DOCUMENTS

| | | | | |
|---|---|---|---|---|
| 3,735,482 A * | 5/1973 | Norris | ............... | H01L 21/31687 204/164 |
| 2005/0074959 A1* | 4/2005 | Burrell | ................ | H01L 23/3192 438/617 |
| 2010/0173494 A1* | 7/2010 | Kobrin | ................ | H01L 21/0337 438/694 |
| 2010/0181675 A1* | 7/2010 | Reynoso | ............. | H01L 23/4952 257/762 |
| 2013/0026618 A1* | 1/2013 | Chen | ................... | H01L 23/3192 257/737 |

* cited by examiner

*Primary Examiner* — Galina Yushina
(74) *Attorney, Agent, or Firm* — Viering, Jentschura & Partner mbB (57) ABSTRACT

Various embodiments provide a semiconductor device, including a final metal layer having a top side and at least one sidewall; and a passivation layer disposed over at least part of at least one of the top side and the at least one sidewall of the final metal layer; wherein the passivation layer has a substantially uniform thickness.

15 Claims, 9 Drawing Sheets

FIG. 1

PRIOR ART

FIG. 2

PRIOR ART

```
forming a final metal layer having a top side and at least     ~ 410
one sidewall
```

```
forming a passivation layer over at least part of at least one
of the top side and the at least one sidewall of the final      ~ 420
metal layer by means of an atomic layer deposition process
```

FIG 4B ~ 450

```
disposing a layer comprising aluminum oxide over a
metallization structure, the metallization structure being     ~ 460
disposed over a surface of a semiconductor carrier.
```

SEMICONDUCTOR DEVICES AND PROCESSING METHODS

RELATED APPLICATION(S)

This application is a divisional of U.S. patent application Ser. No. 13/656,777, entitled, "SEMICONDUCTOR DEVICES AND PROCESSING METHODS", filed on Oct. 22, 2012, which is incorporated herein by reference in its entirety.

TECHNICAL FIELD

Various embodiments relate generally to semiconductor devices and processing methods.

BACKGROUND

Figure 1:
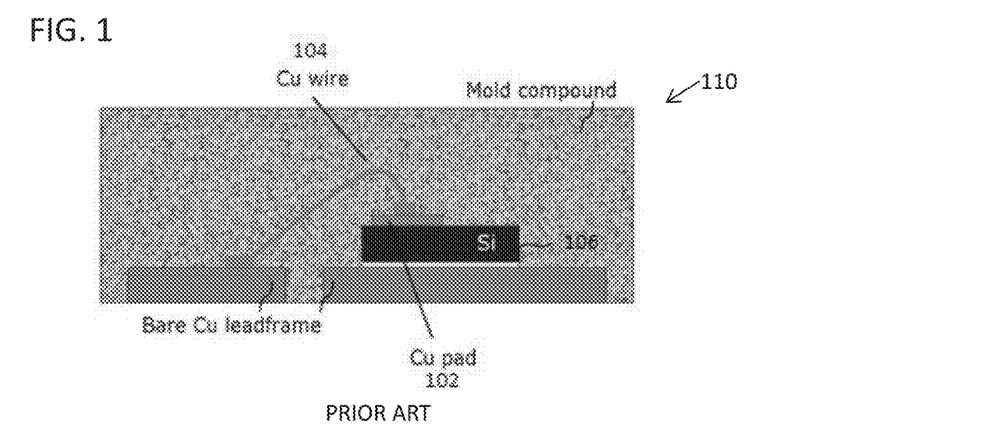
FIG. 1 shows an integrated circuit.

The newest generations of power semiconductor integrated circuits, as shown in FIG. 1 view 110, may use copper metallization pads 102 and/or copper interconnects 104 due to the excellent electrical conductivity of copper. Copper contact pads, especially exposed copper contact pads such as copper pad 102 formed on semiconductor chips such as silicon chip 106, may suffer from reliability issues and degradation problems. Up until now, passivation for copper pads, e.g. organic layer depositions, may not be well integrated. While the copper may be protected, significant and complex problems may occur with respect to probing and wire bonding. Typically, protective passivation for copper pads, such as dielectric materials, e.g. dielectric nitrides or dielectric oxides, may be deposited by standard chemical vapor deposition (CVD) processes. These dielectrics may be or must be relatively thick in order to protect the copper pad 102 and even the side walls and the undercut regions.

Figure 2:
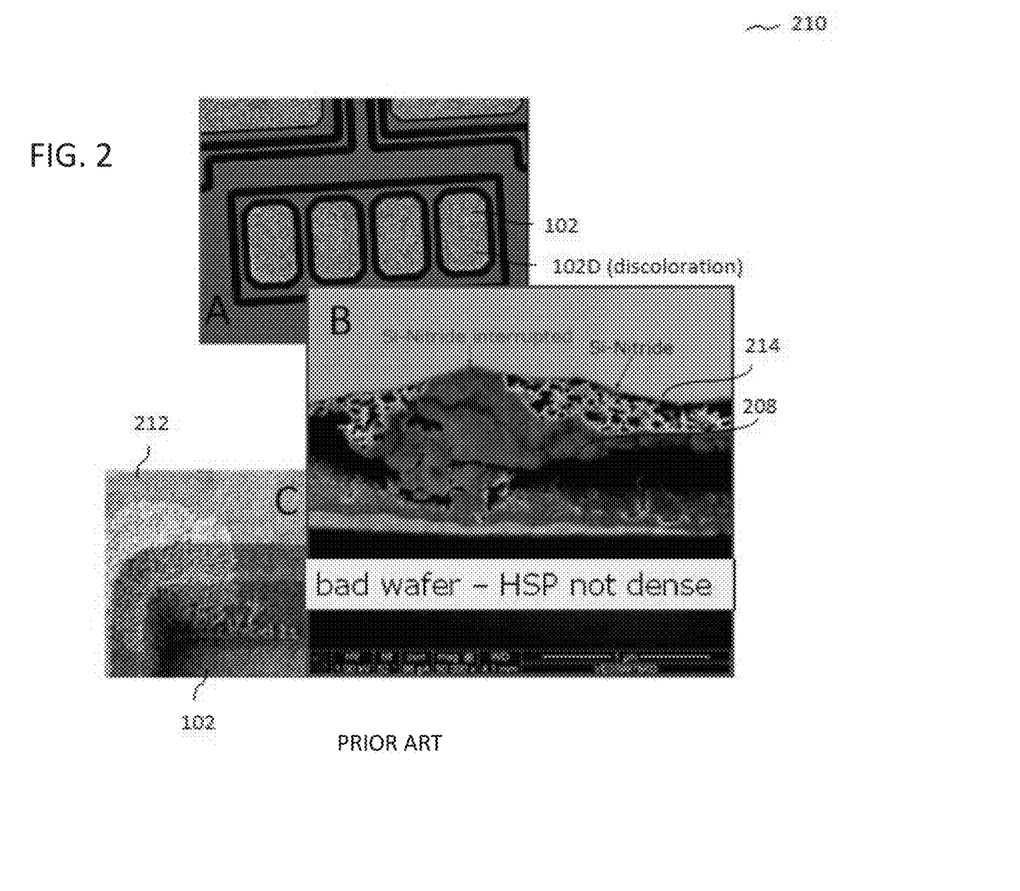
FIG. 2 shows images of reliability problems relating to copper pads.

FIG. 2 shows images of reliability problems relating to copper pads. Copper pads such as bare copper pad 102 in FIG. 1 may suffer from copper oxidation, which may adversely affect a defined copper surface for wire bonding processes. Inset A of FIG. 2 shows an image of an oxidized copper pad 102D which may suffer from discoloration. Copper pads such as copper pad 102 and/or 102D, if opened, may be oxidized during processing, for example on the way from front end processes to back end processes; and furthermore in the back end, e.g. during sawing. This may reduce or affect the bond quality. For example, copper-to-copper bonds and/or aluminum-to-copper bonds on the copper pad may be affected. In extreme cases, the wires (aluminum and/or copper wires) may no longer be able to be bonded to copper pads, which may sometimes be referred to as a non-stick on pad (NSOP) problem.

Copper structures, e.g. copper contact pads, copper lines or copper vias, may further suffer from reliability issues due to dendrite growth. Leakage current between metal lines may occur because of copper electrochemistry e.g. if inter metal isolation dielectric (IMID) or polyimide passivation fails due to delamination, pores, cracks, or contamination, for example on the bottom IMID interfaces. As shown in insets B and C of FIG. 2, growth of copper structures 208, such as growth of copper dendrites 212, may occur from copper pads 102 or other copper lines. Growth of these unwanted copper structures 208, 212 may be caused by exposure to moisture, e.g. moisture leakage through the passivation layer, such as the protective dielectric, and further due to applied electrical voltages to the copper structures for example during electrochemistry, and even during operation of the device. As a result, in operation, neighboring copper pads and/or tracks and/or lines, may connect to each other along weak passivation interfaces. The copper structures may then be affected by short-circuiting due to dendrite growth and/or filament formation.

These issues may affect or hinder the production of a robust and low cost final copper metallization.

SUMMARY

Various embodiments provide a semiconductor device, including a final metal layer having a top side and at least one sidewall; and a passivation layer disposed over at least part of at least one of the top side and the at least one sidewall of the final metal layer; wherein the passivation layer has a substantially uniform thickness.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described for structures or devices, and various embodiments are described for methods. It may be understood that one or more (e.g. all) embodiments described in connection with structures or devices may be equally applicable to the methods, and vice versa.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Metallization structures, such as copper interconnects such as copper wires and copper bond pads and copper lines may increasingly be used in semiconductor chips due to their ability to reduce power loss and to increase circuit integration. In comparison to aluminum, other metals, for example non-noble metals such as copper, silver, and palladium may be more susceptible to oxidation and/or corrosion and/or contamination. But also aluminum structures may need in some cases special protection against any contamination of their surfaces. Furthermore, due to copper oxide formation and dendrite formation, copper may always need to be protected with a metallic pad-cap layer on the pads, or with barrier layers and/or passivation layers formed over metal lines, therefore leading to higher costs. Typically, chemical vapor deposition (CVD) methods and molecular vapor deposition (MVD) may be used, which may produce layers and/or cap layers which may not be conformal enough to prevent growth of copper structures and/or copper based-dendrites. Furthermore, if used, very thick layers would be needed. Dendrites may then at best only be prevented or repressed in part. For example, during the electroless deposition of the cap layer, gaps in the junction may remain between copper and dielectric layers, which may allow dendrites to grow. As these depositions using CVD may not be conformal enough, there may be problems with bonding.

Various embodiments provide a thin passivation layer with uniform thickness for a metallization structure or layer, for example a final metal layer, e.g. a metal pad or metal line, of a semiconductor device, for example a chip or wafer.

In one or more embodiments, the term "final metal layer" may include a metal layer of a final metallization level (e.g. top metallization level) of a semiconductor device (for example, chip or wafer).

In one or more embodiments, the passivation layer may be formed over the metallization structure or layer by means of an atomic layer deposition (ALD) process, which may achieve an excellent conformal coverage of the metallization structure with material of the passivation layer.

Various embodiments provide a robust copper passivation material which may be deposited such that copper oxide reduction and passivation of the copper pad may be achieved in situ.

Various embodiments provide a method for manufacturing a metallization structure including copper, e.g. a copper pad, wherein passivation and/or protection of the copper may be achieved through deposition of aluminum oxide ($Al_2O_3$) deposited by an atomic layer deposition (ALD) process.

Various embodiments provide a method for manufacturing a metallization structure which may provide easy integration between semiconductor fabrication front end and semiconductor fabrication back end processes. This provision may be crucial to the copper pads in particular if long transition journeys and/or times are present between the front end and back end processes.

Various embodiments provide a method for protecting a metallization structure, e.g. a metallization structure including copper, e.g. a copper pad, wherein a very thin layer, e.g. a layer having a thickness in the range of about 5 nm to about 20 nm, may be used to protect the metallization structure, such that minimal or no problems may be expected with testing and bonding.

Various embodiments provide a method for protecting a metallization structure, e.g. a metallization structure including copper, e.g. a copper line, wherein a very thin layer, e.g. a layer having a thickness in the range of about 5 nm to about 20 nm, may be used to protect the metallization structure, such that minimal or no problems may be expected with dendrite growth.

Various embodiments provide a method for protecting a metallization structure which may be low in cost and provide a robust protection for a metal pad without requiring additional structuring.

Various embodiments provide a reliable and cost-saving contact pad metallization for copper wire bonding to displace expensive power copper metallization.

Figure 3A:
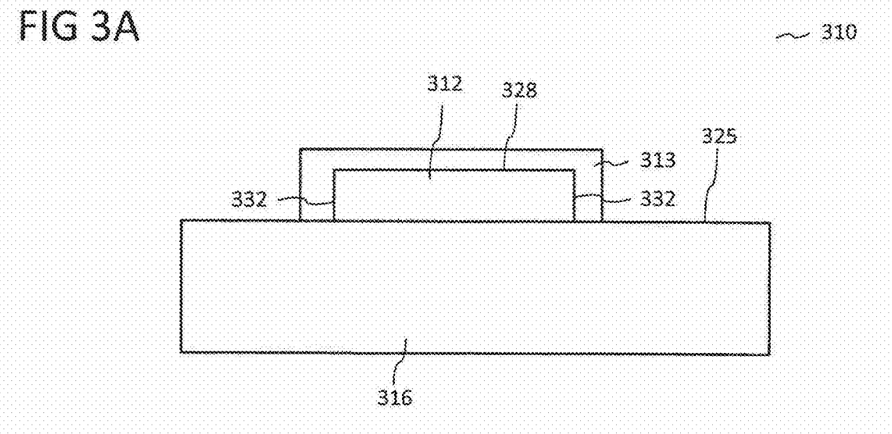
FIG. 3A shows a semiconductor device according to an embodiment.

FIG. 3A shows a semiconductor device 310 according to an embodiment. Semiconductor device 310 may include:

a final metal layer 312 having a top side 328 and at least one sidewall 332; and a passivation layer 313 disposed over at least part of at least one of the top side 328 and the at least one sidewall 332 of the final metal layer 312; wherein the passivation layer 313 has a substantially uniform thickness.

In an embodiment, semiconductor device 310 may include a semiconductor carrier 316 having a surface or side 325, wherein the final metal layer 312 may be disposed at or over the surface or side 325 of the semiconductor carrier 316.

Figure 3B:
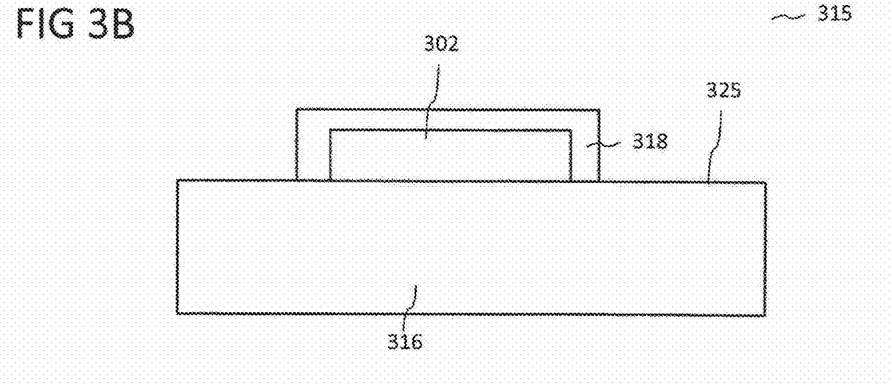
FIG. 3B shows a metallization structure arrangement according to an embodiment.

FIG. 3B shows a metallization structure arrangement 315 according to an embodiment. Metallization structure arrangement 315 may include:

semiconductor carrier 316 including metallization structure 302 formed over surface 325 of semiconductor carrier 316; and layer 318 including aluminum oxide disposed over at least part of metallization structure 302.

In an embodiment, metallization structure 302 may include or may be a final metal layer such as final metal layer 312 shown in FIG. 3A.

Figure 3C:
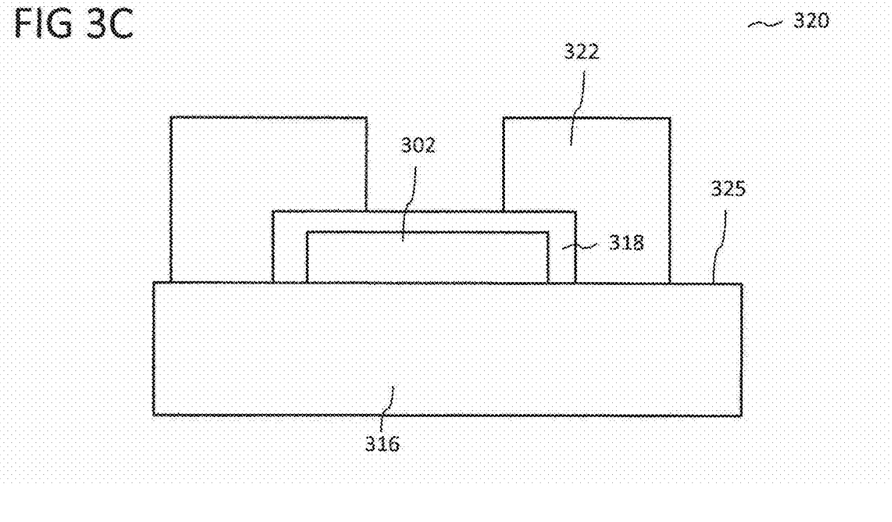
FIG. 3C shows a semiconductor chip arrangement according to an embodiment.

FIG. 3C shows a semiconductor chip arrangement 320 according to an embodiment. Semiconductor chip arrangement 320 may include:

semiconductor chip 316 including metallization structure 302 formed over surface 325 of semiconductor chip 316;

aluminum oxide layer 318 and passivation layer 322 disposed at least partially over metallization structure 302.

In an embodiment, metallization structure 302 may include or may be a final metal layer such as final metal layer 312 shown in FIG. 3A.

Figure 4A:
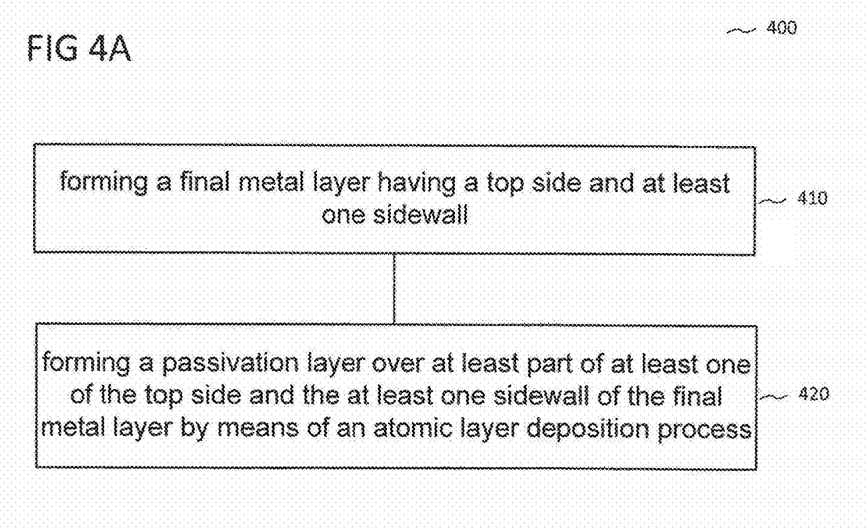
FIG. 4A shows a method for processing a semiconductor device according to an embodiment.

FIG. 4A shows method 400 for processing a semiconductor device according to an embodiment.

Method 400 may include:

forming a final metal layer having a top side and at least one sidewall (in 410); and forming a passivation layer over at least part of at least one of the top side and the at least one sidewall of the final metal layer (in 420) by means of an atomic layer deposition process.

Figure 4B:
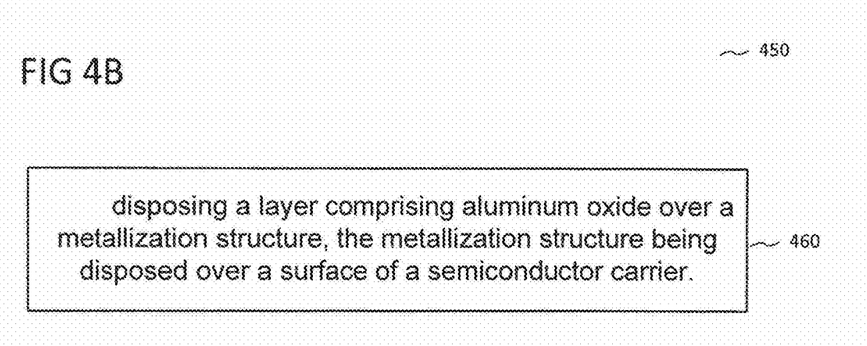
FIG. 4B shows a method for manufacturing a metallization structure arrangement according to an embodiment.

FIG. 4B shows method 450 for manufacturing a metallization structure arrangement according to an embodiment.

Method 450 may include:

disposing a layer including aluminum oxide over a metallization structure, the metallization structure being disposed over a surface of a semiconductor carrier (in 460).

FIGS. 5A to 5H show various stages in a method 500 for manufacturing a metallization structure arrangement according to an embodiment.

Figure 5A:
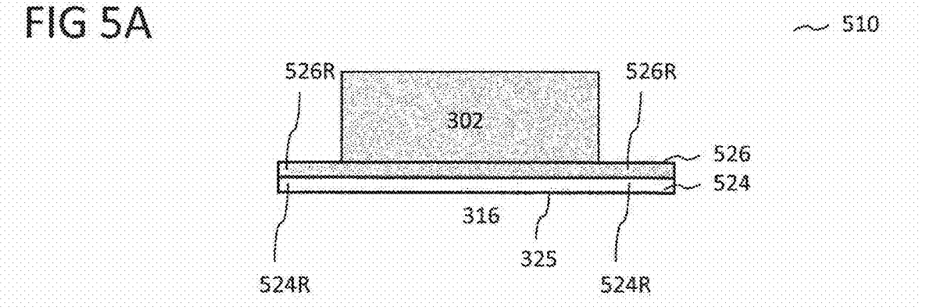
FIGS. 5A to 5H show various stages in a method for manufacturing a metallization structure arrangement according to an embodiment.

Method 500 may include forming metallization structure 302 over semiconductor carrier 316. According to some embodiments, metallization structure 302 may include or may be a final metal layer such as final metal layer 312 shown in FIG. 3A. According to some embodiments, metallization structure 302 may include a metal, e.g. a non-noble metal, such as copper and/or silver and/or palladium. According to some embodiments, metallization structure 302 may include any metal, e.g. palladium, aluminum, silver, tungsten or tin. For example, according to some embodiments, metallization structure 302 may include an aluminum alloy and/or copper alloy and/or silver alloy and/or palladium alloy. According to some embodiments, metallization structure 302 may include a contact pad and/or bond pad and/or metal line and/or via. According to some embodiments, metallization structure 302 may be a copper metallization structure 302, in other words, formed primarily and substantially from copper and/or copper alloy.

Semiconductor carrier 316 may include a surface and/or side 325, wherein metallization structure 302 may be formed over surface and/or side 325.

Semiconductor carrier 316 may include a semiconductor chip, e.g. a semiconductor die, which may include a wafer substrate. The semiconductor chip may include one or more electronic components formed over the wafer substrate. The wafer substrate may include various materials, e.g. semiconductor materials. The wafer substrate may include at least one material from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator (SOI) wafer. According to an embodiment, the wafer substrate may include a semiconductor compound material, e.g. gallium arsenide (GaAs), or indium phosphide (InP). According to an embodiment, the wafer substrate may include a ternary semiconductor compound material, e.g. indium gallium arsenide (InGaAs).

As shown in cross-sectional view 510 of FIG. 5A, barrier layer 524 may be formed over side and/or surface 325 of semiconductor carrier 316. Barrier layer 524 may have a thickness ranging from about 10 nm to about 300 nm, e.g. about 50 nm to about 200 nm, e.g. about 75 nm to about 150 nm. Side 325 may include a top side, i.e. top surface or a bottom side, i.e. bottom surface of semiconductor carrier 316. Seed layer 526 may be formed over barrier layer 524. Seed layer 526 may be a layer including copper, or a copper layer. Seed layer 526 may have a thickness ranging from about 50 nm to about 300 nm, e.g. about 75 nm to about 250 nm, e.g. about 100 nm to about 200 nm. Barrier layer 524 may be a diffusion barrier, which may prevent diffusion of copper into semiconductor carrier 316. Barrier layer 524 may, for example, include at least one of TiW, TiN and TaN. For example, barrier layer 524 may be at least one of a TiW layer a TiN layer and a TaN layer. Photolithography and/or photo-masking, e.g. which may include photoresist deposition, photoresist patterning, and exposure, may be carried out to ensure that metallization structure 302 may be formed in selected areas over seed layer 526. Seed layer 526 may be subjected to a flash cleaning, for example, using oxygen, to clean seed layer 526 surface before plating. Metallization structure 302 may include at least one of a metal contact pad, a line, a plug and a via. In some embodiments, metallization structure 302, e.g. a copper pad, may be grown over copper seed layer 526, using electroplating. In some embodiments, metallization structure 302, may include a copper/nickel/palladium stack. According to an embodiment, surface and/or side 325 may be a top surface of semiconductor carrier 316. According to another embodiment, surface and/or side 325 may be a bottom surface of the chip. In other words, metallization structure 302 may include a contact pad, line or via formed over or directly on a chip top side. Alternatively, metallization structure 302 may include a backside metallization formed over or directly on a chip bottom side. It may be understood that metallization structure 302 may be formed by various methods, for example by electroplating or a damascene process.

Figure 5B:
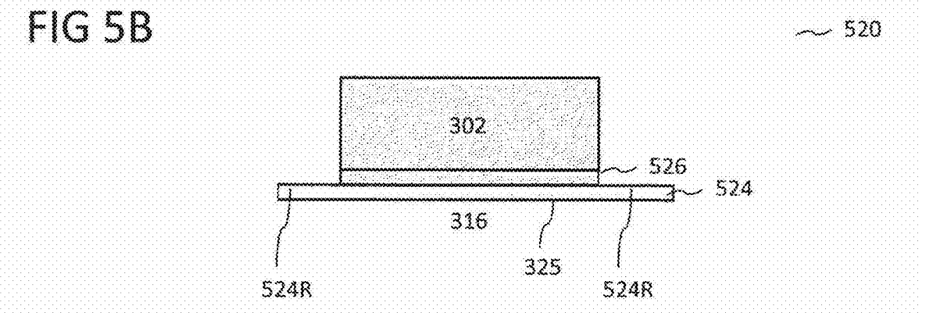

As shown in cross-sectional view 520 of FIG. 5B, following the formation of metallization structure 302, the photoresist may be removed, for example, by stripping the photoresist from the chip surface. During the resist removal process, copper oxide organics may be removed.

Subsequently, a wet etch process may be carried out in order to remove parts 526R of copper seed layer 526 not covered by metallization structure 302. Furthermore, reactive ion etching may be used to remove parts 524R of barrier layer 524 not covered by metallization structure 302.

Figure 5C:
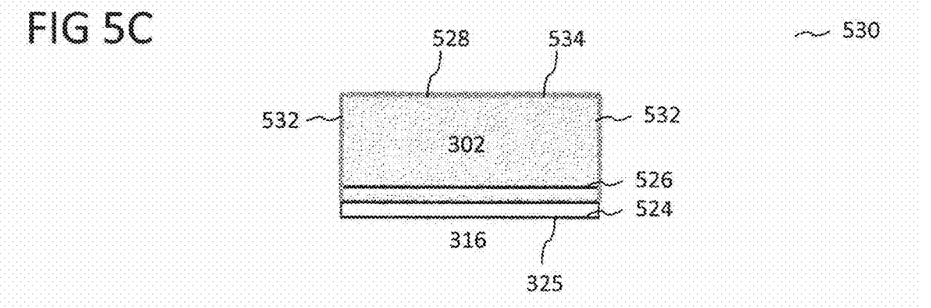

As shown in cross-sectional view 530 of FIG. 5C, following removal of parts 526R, 524R of seed layer 526 and barrier layer 524, discoloration 534 of metallization structure 302, e.g. copper pad 302, may occur as an effect of the etching. The discoloration of copper, e.g. due to the formation of copper oxide or copper-sulphur, may occur over top side 528 of metallization structure 302 and side walls 532 of metallization structure 302. Etching may be carried out to remove discoloration 534 from metallization structure 302, for example using wet or dry etching methods.

Figure 5D:
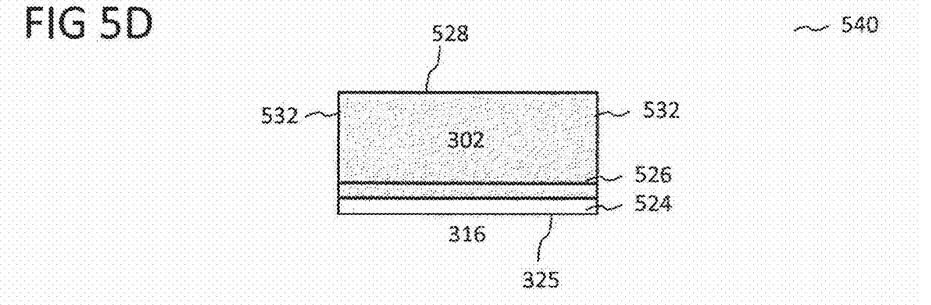
Figure 5E:
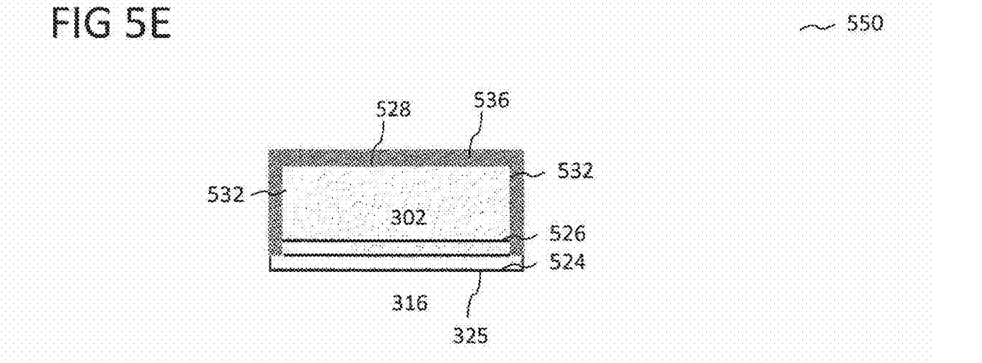

Furthermore, as shown in cross-sectional views 540 and 550 of FIGS. 5D and 5E, annealing may be carried out. Annealing may cause impurities and/or residues 536 to be precipitated at the surfaces of metallization structure 302, for example at the surfaces of top side 528 and side walls 532 of metallization structure 302.

Impurities 536 may be removed from top side 528 and side walls 532 of metallization structure 302. For example, this may be carried out by dry or wet etching, resulting in selective removal of surface regions of metallization structure 302 as shown in cross-sectional view 560 of FIG. 5F.

Figure 5F:
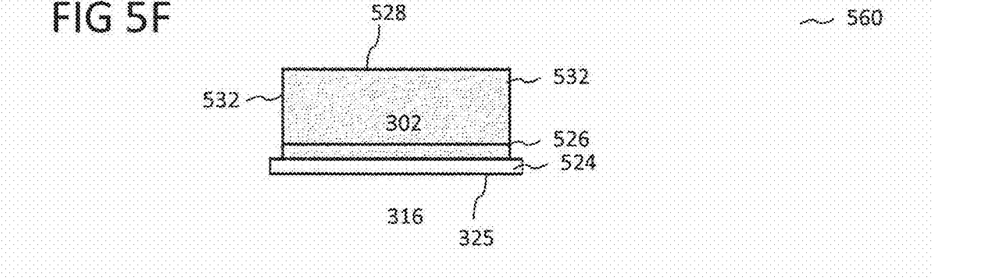

Annealing may result in clean copper surfaces of metallization structure 302. Furthermore, annealing may result in that copper in metallization structure 302 may be crystallized.

Figure 5G:
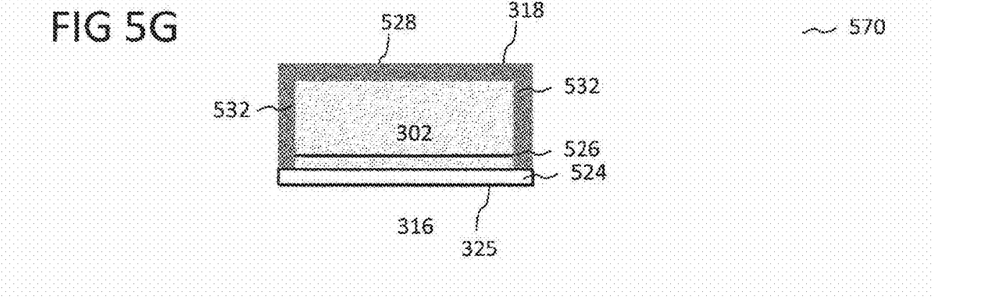

As shown in cross-sectional view 570 of FIG. 5G, layer 318 including aluminum oxide may be disposed over metallization structure 302 of semiconductor carrier 316.

Layer 318 including aluminum oxide may be disposed over metallization structure 302 by an atomic layer deposition (ALD) process. The atomic layer deposition process may result in forming layer 318 including aluminum oxide conformally over at least one surface of the metallization structure 302 e.g. over top side 528 and side walls 532 of metallization structure 302. ALD may generally result in an aluminum oxide layer having substantially up to nearly 100% edge coverage, which grows virtually on every surface. In other words, excellent conformal coverage may be attained over edges, bumps, columns, undercuts and pores, which may be reliably covered using ALD. Minimal or no open or leaky portions may be formed on the wafer surface. As a result, dendrite growth may be suppressed. In one or more embodiments, layer 318 including aluminum oxide may be arranged such that formation of metal oxides, such as an oxide of copper at a surface of a metallization structure, e.g. top side 528 and/or side walls 532, may be prevented. In one or more embodiments, layer 318 including aluminum oxide may be arranged such that growth of additional structures, such as copper structures from metallization structure 302 may be prevented. In one or more embodiments, layer 318 including aluminum oxide may be arranged such that at least one of contamination and corrosion at a surface of the metallization structure 302, e.g. top side 528 and/or side walls 532, may be prevented.

Layer 318 including aluminum oxide may have a thickness of less than or equal to about 100 nm, e.g. less than or equal to about 50 nm, e.g. less than or equal to about 20 nm, e.g. less than or equal to about 10 nm, e.g. less than or equal to about 5 nm, e.g. in the range from about 1 nm to about 100 nm, e.g. in the range from about 1 nm to about 50 nm, e.g. in the range from about 1 nm to about 20 nm, e.g. in the range from about 5 nm to about 20 nm, e.g. in the range from about 1 nm to about 10 nm, e.g. in the range from about 5 nm to about 10 nm, e.g. in the range from about 1 nm to about 5 nm. Layer 318 including aluminum oxide may cover top side 528 and/or one or more side walls 532 of metallization structure 302. Layer 318 including aluminum oxide may encapsulate metallization structure 302. According to some embodiments, layer 318 including aluminum oxide may be an aluminum oxide layer, in other words a substantially pure aluminum oxide layer. According to other embodiments, layer 318 including aluminum oxide may further include dopant elements, for example, at least one of titanium, zinc, silicon, organic materials, or carbon, which may modify the elasticity of layer 318.

Figure 5H:
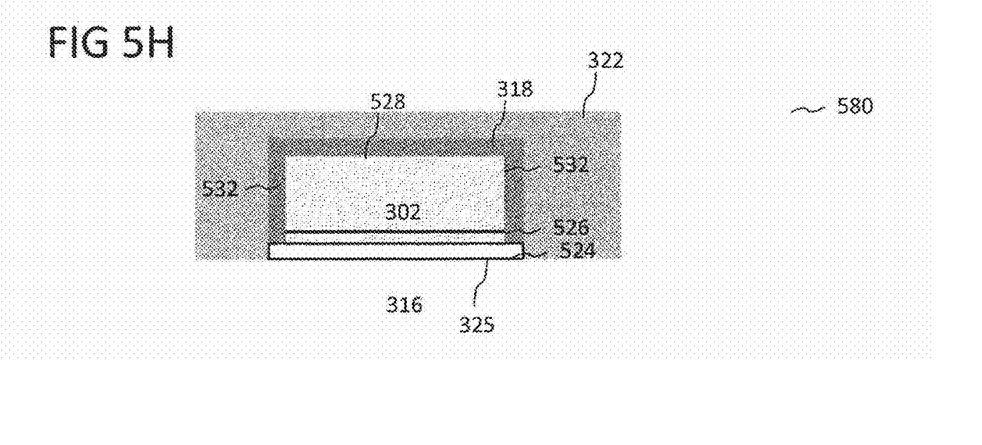

As shown in cross-sectional view 580 of FIG. 5H, layer 318 including aluminum oxide and passivation layer 322 may be disposed at least partially over metallization structure 302.

As shown in view 580, layer 318 may be at least partially surrounded with passivation layer or passivation material 322.

Passivation layer 322 may include at least one material from the following group of materials, the group of materials consisting of: polyimide, epoxy, polymer, silicon dioxide, silicon nitride. Passivation layer 322 may be deposited by deposition methods, such as at least one of: chemical vapor deposition, physical vapor deposition, evaporation, spin coating, sputtering.

It may be understood that layer 318 including aluminum oxide may conformally cover metallization structure 302, and as passivation layer 322 covers aluminum oxide layer 318, metallization structure 302 may be well protected from the external environment. Therefore, semiconductor carrier 316 including metallization structure 302 may be transported from the front end processing facilities to back end processing facilities without exposing metallization structure 302 to oxidation and contamination.

After manufacturing the metallization structure arrangement, as described according to FIGS. 5A to 5H, method 500 may further include forming hole 638 through at least one of passivation layer 322 and layer 318, and forming interconnect structure 642 through hole 638 thereby electrically connecting interconnect structure 642 to metallization structure 302. Hole 638 may be formed during a front end process.

It may be understood that according to various embodiments, passivation layer 322 may be omitted. In other words, layer 318 may be the final protective layer formed over metallization structure 302.

Figure 5I:
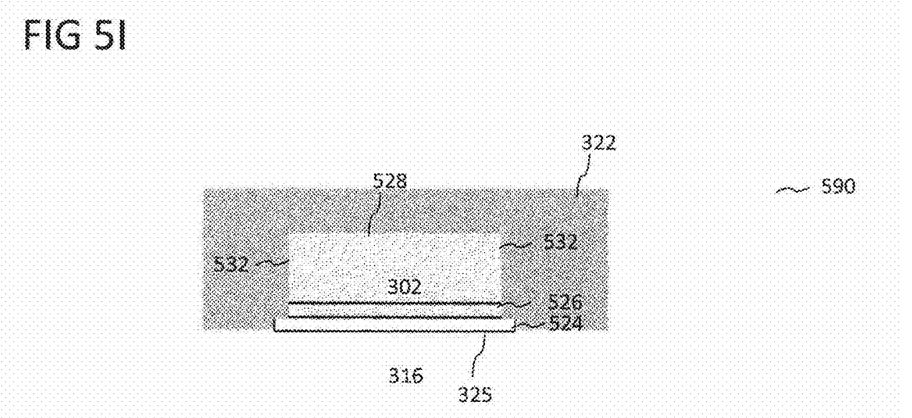
FIG. 5I and FIG. 5J show various stages in a method for manufacturing a metallization structure arrangement according to an embodiment.
Figure 5J:
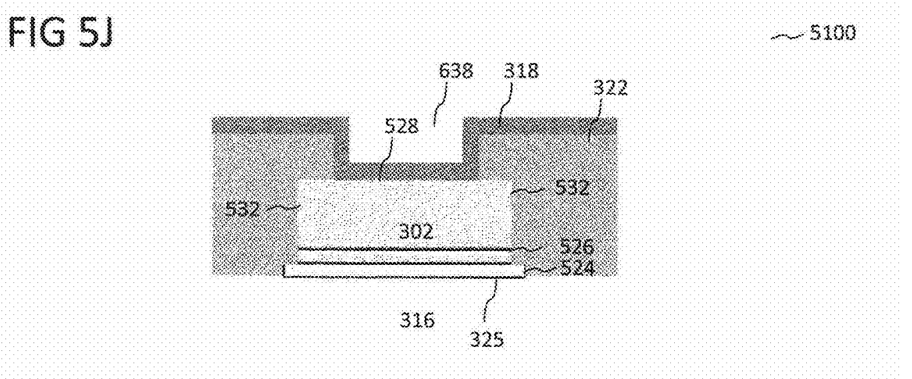

According to other embodiments, passivation layer 322 may be deposited over metallization structure 302 before forming layer 318 over metallization structure. As shown in cross-sectional views 590 of FIG. 5I, passivation layer 322 may be deposited over metallization structure 302, for example, directly on or covering at least one of top side 528 and one or more side walls 532 of metallization structure 302. Hole 638 may be formed through passivation layer 322 to expose at least part of metallization structure 302. Layer 318 may then be deposited over, e.g. directly on, the exposed part of metallization structure 302 and/or over passivation layer 322, as shown in cross-sectional view 5100 of FIG. 5J.

It may be understood that using standard photolithography and/or masking techniques, it may be possible to deposit or form layer 318 and/or passivation layer 322 over selected areas of metallization structure 302. For example, it may be possible to limit the formation of layer 318 including aluminum oxide to one or more side walls 532 of metallization structure 302 only. For example, it may be possible to limit the formation of layer 318 including aluminum oxide to top side 528 of metallization structure 302 only. Surfaces of metallization structure 302 which are not covered by layer 318 may be covered by passivation layer 322 or other layers, e.g. other metal layers.

Figure 6:
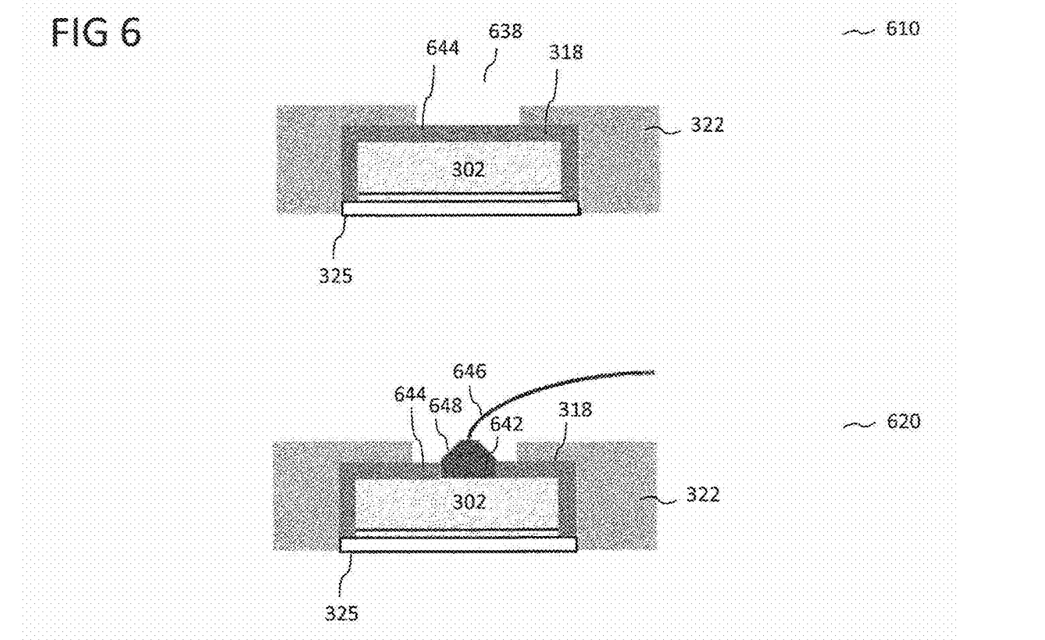
FIG. 6 shows various stages in a method for manufacturing a metallization structure arrangement according to an embodiment.

According to various embodiments as shown in cross-sectional view 610 of FIG. 6, hole 638 may be formed through passivation layer 322, wherein the hole may be arranged over aluminum oxide layer 318. Hole 638 may be formed by lithography and etching, e.g. oxygen plasma etching. Formation of hole 638 may expose portion 644 of aluminum oxide layer 318. As aluminum oxide layer 318 may be formed conformally over metallization structure 302, any residues leftover from etching, such as fluoride residues or sulphide residues, may be prevented from forming directly on and/or contacting metallization structure 302 in accordance with one or more embodiments. In particular, metallization structure 302 formed from or including aluminum, may be susceptible to contamination and/or corrosion caused by the residues if the residues were to be allowed to directly contact metallization structure 302, even if a native aluminum oxide layer were present on the aluminum surfaces. In accordance with one or more embodiments, corrosion and/or contamination of metallization structure 302 may be prevented by the presence of aluminum oxide layer 318 formed conformally over metallization structure 302. Aluminum oxide layer 318, which may, for example, have a thickness ranging from about 5 nm to about 20 nm, may be sufficiently thick to prevent any direct contact of residues with metallization structure 302. As shown in cross-sectional view 620 of FIG. 6, interconnect structure 642 may include electrically conductive wire 646 and wire bond structure 648. Wire bond structure 648 may include at least one of a ball bond and a wedge bond. Wire bond structure 648 may be bonded, e.g. welded, to metallization structure 302. The bonding process may be carried out during a back end process, for example at a back-end processing facility. It may be possible that due to the thinness of aluminum oxide layer 318, it may be possible to electrically connect wire bond structure 648 to metallization structure 302 without carrying out a separate process to remove portion 644 of aluminum oxide layer 318. The bonding, e.g. welding, process for bonding wire bond structure 648 to metallization structure 302 may be sufficient to break through the thin layer (for example, about 5 nm to about 10 nm) of aluminum oxide 318, in order for wire bond structure 648 to be electrically connected to metallization structure 302. Therefore, interconnect structure 642 may be electrically connected to metallization structure 302 via aluminum oxide layer 318.

Figure 7:
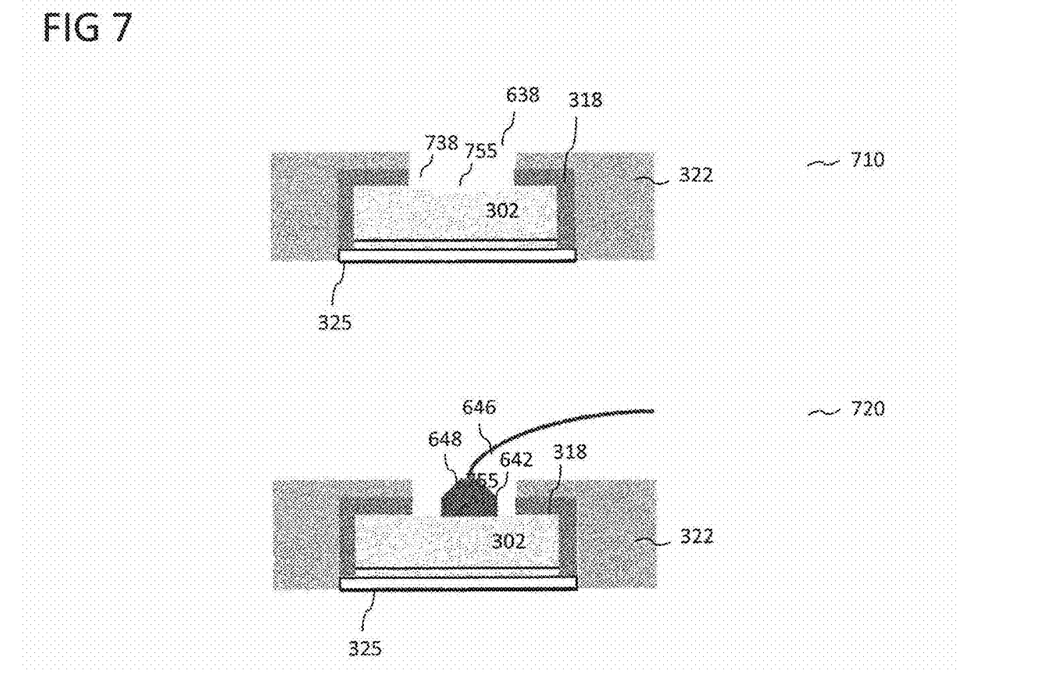
FIG. 7 shows various stages in a method for manufacturing a metallization structure arrangement according to an embodiment.

According to various embodiments as shown in cross-sectional view 710 of FIG. 7, hole 638 may be formed through passivation layer 322. Furthermore, hole 738 may be formed through aluminum oxide layer 318, for example, through at least one region of portion 644 of aluminum oxide layer 318. Hole 638 may be formed by etching, e.g. oxygen plasma etching. Hole 738 may be formed by etching, e.g. by methanesulfonic acid (MSA) and/or hydrofluoric (HF) acid, thereby exposing region 755 of metallization structure 302. These processes may be carried out if layer 318 including aluminum oxide is too thick to be broken through by bonding of wire bond structure 648 to metallization structure 302 alone. For example, if layer 318 including aluminum oxide has a thickness larger than 15 nm. As shown in cross-sectional view 720 of FIG. 7, wire bond structure 648 may be bonded to metallization structure 302, e.g. to region 755 of metallization structure 302, through hole 638 and hole 738 formed through passivation layer 322 and layer 318 including aluminum oxide respectively. For example, wire bond structure 648 may be formed at least partially in hole 738 and hole 638. Interconnect structure 642 may therefore be electrically connected to metallization structure 302.

It may be understood that according to various embodiments, hole 638 and hole 738 may be of approximately the same dimension, and may form a single opening over metallization structure 302.

Figure 8A:
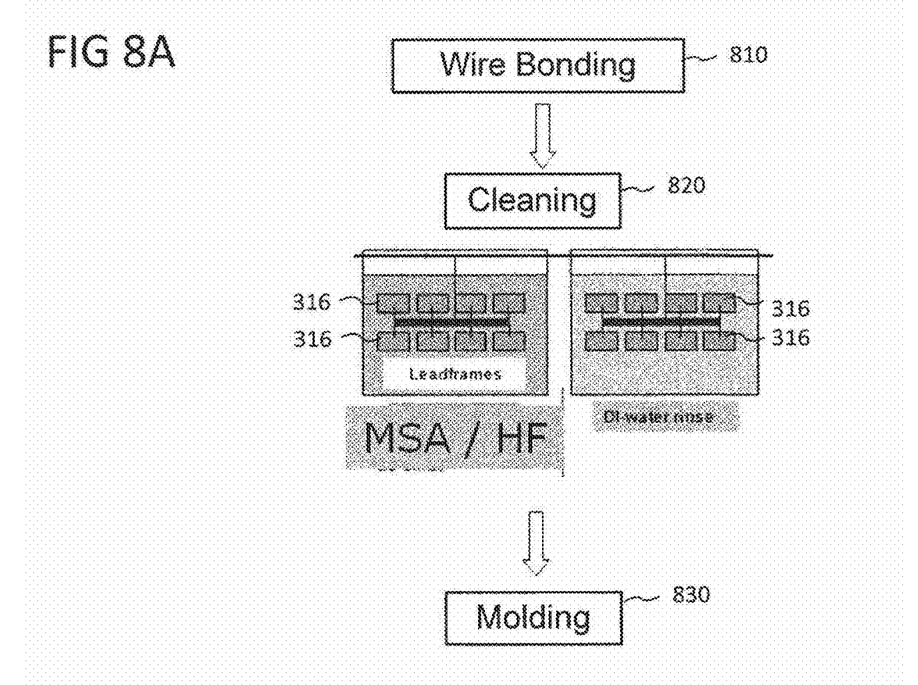
FIG. 8A shows a process flow diagram illustrating various stages in a method for manufacturing a metallization structure arrangement according to various embodiments.

FIG. 8A shows a process flow diagram illustrating various stages in a method for manufacturing a metallization structure arrangement according to various embodiments. The process flow diagram may show processes carried out during a back end assembly.

In view 810, the bonding or wire bonding process as described according to FIG. 6 may be carried out. As described earlier, during the bonding process, which may include welding, the wire bonding process for bonding wire bond structure 648 to metallization structure 302 may be sufficient to break through the thin layer of aluminum oxide 318.

Subsequently as shown in view 820, a back end cleaning process may be carried, wherein semiconductor carrier 316 including metallization structure arrangement may be dipped or submerged in methanesulfonic acid (MSA) and/or hydrofluoric (HF) acid. MSA and/or HF may remove portion 644 of aluminum oxide layer 318. A rinse process may subsequently be carried out, for example, using deionized (DI) water, as shown in view 820.

As shown in view 830, molding may then be carried out wherein an encapsulation material, e.g. a mold material, may be formed over semiconductor carrier 316, thereby surrounding semiconductor carrier 316, covering metallization structure 302 and electrically insulating and/or surrounding interconnect structure 642.

It may be understood that optionally additional process steps may be carried out between wire bonding and molding.

Figure 8B:
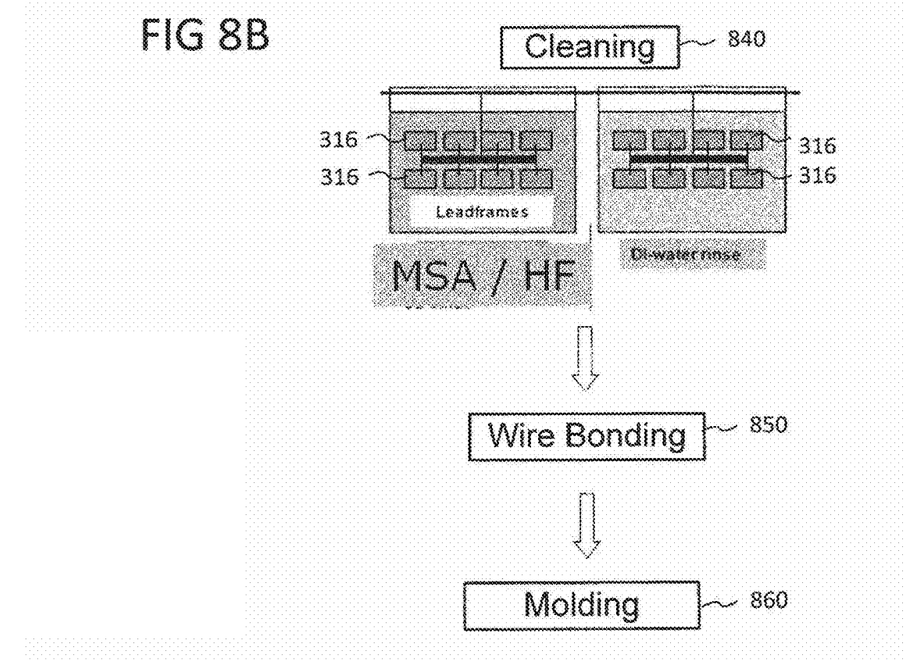
FIG. 8B shows a process flow diagram illustrating various stages in a method for manufacturing a metallization structure arrangement according to other embodiments.

FIG. 8B shows a process flow diagram illustrating various stages in a method for manufacturing a metallization structure arrangement according to other embodiments. Similarly to FIG. 8A, the process flow diagram in FIG. 8B may show processes carried out during a back end assembly.

As shown in view 840, hole 738 may be formed as described in connection with view 710 of FIG. 7. As described earlier in connection with view 820 of FIG. 8A, in a cleaning process, MSA and/or HF may be used to remove portions of layer 318 including aluminum oxide which may be covering metallization structure 302, and which may not be covered by passivation layer 322.

As shown in view 850, wire bonding may be carried out as described in connection with view 720 of FIG. 7, wherein wire bond structure 648 may be bonded to metallization structure 302, e.g. to region 755 of metallization structure 302, through hole 638 and hole 738 formed through passivation layer 322 and layer 318 including aluminum oxide respectively.

In view 860, molding may be carried out wherein an encapsulation material, e.g. a mold material, may be formed over semiconductor carrier 316, thereby surrounding semiconductor carrier 316, covering metallization structure 302 and electrically insulating and/or surrounding interconnect structure 642. It may be understood that optionally additional process steps may be carried out between cleaning and molding.

Figure 9:
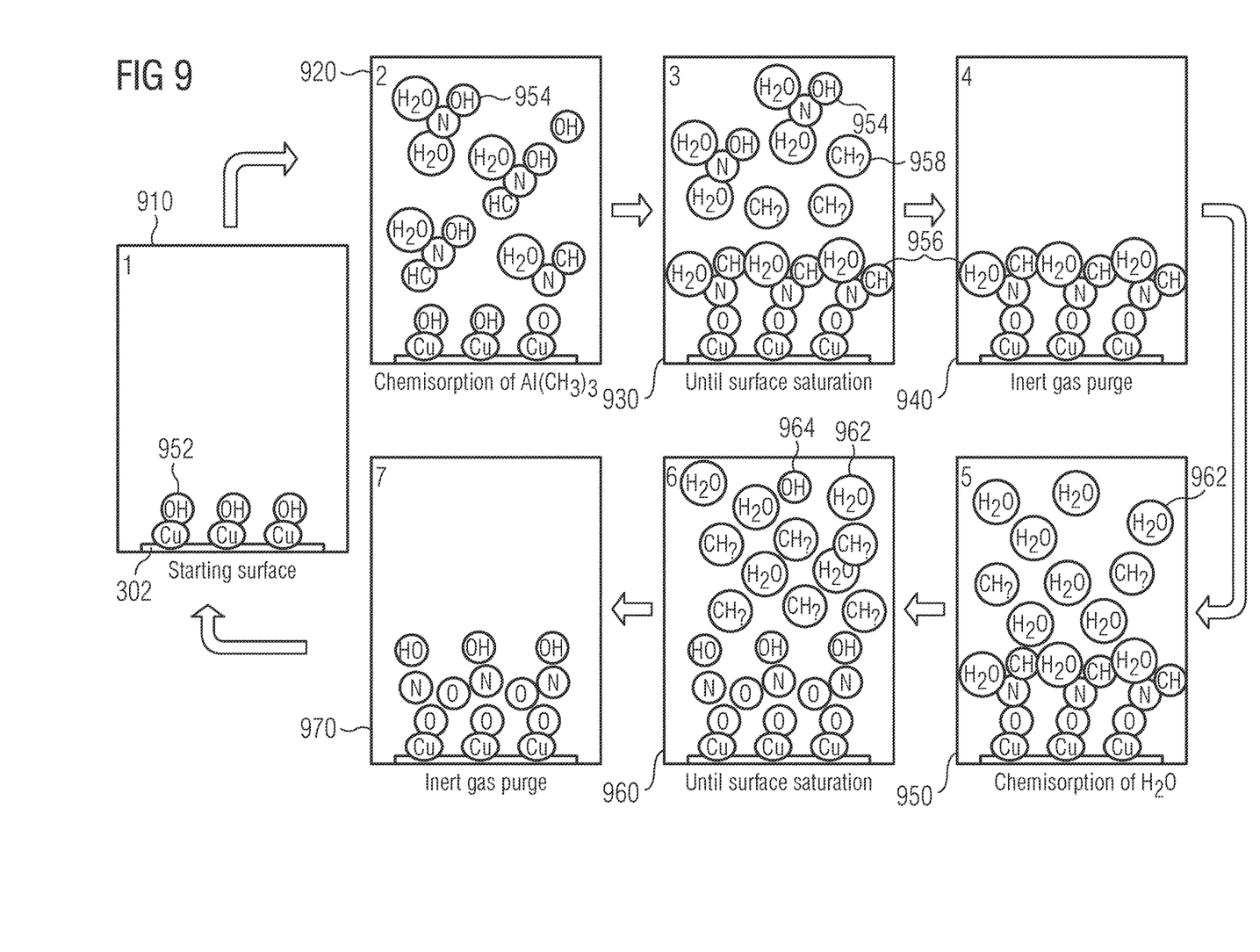
FIG. 9 shows various views illustrating a process principle of an atomic layer deposition process that may be used to grow a layer including aluminum oxide in a method for manufacturing a metallization structure arrangement according to various embodiments.

FIG. 9 shows various views illustrating a process principle of an atomic layer deposition process that may be used to grow a layer including aluminum oxide, e.g. an aluminum oxide layer, such as layer 318, over a metallization structure such as metallization structure 302 in a method for manufacturing a metallization structure arrangement according to various embodiments. In the following description, it is assumed that metallization structure 302 includes or consists of copper, however metallization structure 302 may include other metals or metal alloys in accordance with other embodiments, and .

Views 910 to 970 show an illustration of an initial reaction cycle in ALD growth of layer 318 including aluminum oxide, wherein in situ Cu-oxide reduction and passivation by layer 318 including aluminum oxide may be achieved.

As described with respect to FIG. 5G, layer 318 including aluminum oxide, i.e. the protection layer for the copper of metallization structure 302, may be applied and/or deposited after the final conditioning of metallization structure 302, e.g. after crystallization of copper and/or tempering processes. The previously described annealing process prior to the deposition of layer 318 including aluminum oxide may result in the desired crystallization of the final metallization.

Forming gas, e.g. a mixture of nitrogen and hydrogen may reduce any copper oxide formed in metallization structure 302 to copper. Due to various reasons though, e.g. even after the use of forming gas, a thin native oxide 952, e.g. copper oxide, may still be present on surfaces, e.g. top side 528 and sidewalls 532 of metallization structure 302. Oxidizing precursors, such as water and/or alcohol e.g. isopropanol or ethanol or methanol, may be introduced on surfaces of metallization structure 302 (in view 910).

In view 920, an aluminum ALD precursor 954 may be introduced over metallization structure 302. This aluminum precursor 954 typically may be trimethylaluminum (Al(CH$_3$)$_3$) (TMA).

As shown in view 920, the aluminum ALD precursor 954 (here: TMA) may be able to reduce the native oxide 952 at the initial stage of ALD growth of aluminum oxide. As shown in 920, TMA 954 may be chemisorbed at the oxidized metal pad surface via Al—O—Cu bonds replacing Al—CH$_3$ bonds of the TMA 954, until surface saturation with chemisorbed TMA 956 occurs, as shown in view 930. Excess CH$_3$ groups 958 as well as excess TMA 954 may be purged with inert gas as shown in view 940.

In view 950, an oxidizing precursor, e.g. water 962 (as shown in view 950) and/or alcohols (e.g. isopropanol (IPA), not shown in view 950), may be introduced to replace methyl groups of chemisorbed TMA 954 with OH groups and form Al—O—Al bonds between neighboring chemisorbed TMA 954 molecules. Chemisorption of water and/or alcohols may occur until surface saturation as shown in view 960.

Purging with inert gas may be carried out in view 970 to remove excess methyl groups 964 and water 962 (and/or alcohols). The surface structure shown in view 970 then may serve as a starting surface for a further ALD reaction cycle. During the use of ALD for deposition of aluminum oxide layer 318, no copper oxide may be formed or created, due to the reducing effect of the TMA. Furthermore, as TMA reduces the copper oxide, layer 318 including aluminum oxide may be formed and/or deposited directly onto the copper surface as a result.

The typical process temperatures may lie in a wide temperature window, e.g. ranging from about room temperature to about 450° C., e.g. between about 80° C. to about 400° C., which may be fully compatible with Cu. In cases wherein copper may be especially susceptible to corrosion, e.g. by water, the deposition may be carried out with TMA and alcohol, e.g. isopropanol, instead of water.

It may be understood that disposing layer 318 including aluminum oxide over metallization structure 302 of semiconductor carrier 316 may include forming a chemical reaction at the surface, e.g. top side 528 and/or one or more sidewalls 532, of metallization structure 302 such that oxides of copper are removed from the metallization structure 302.

Disposing layer 318 including aluminum oxide over metallization structure 302 of semiconductor carrier 316 may include disposing layer 318 including aluminum oxide over metallization structure 302 of semiconductor carrier 316 such that layer 318 including aluminum oxide prevents formation of an oxide of copper at a surface, e.g. top side 528 and/or one or more sidewalls 532 of metallization structure 302.

Disposing layer 318 including aluminum oxide over metallization structure 302 of semiconductor carrier 316 may include disposing layer 318 including aluminum oxide over metallization structure 302 of semiconductor carrier 316 wherein layer 318 including aluminum oxide may prevent growth of copper structures from metallization structure 302. The atomic layer deposition process may include an aluminum precursor, typically trimethylaluminum (TMA), and an oxidizing precursor, typically water or oxygen and/or ozone, in accordance with some embodiments. In accordance with other embodiments, the atomic layer deposition process of aluminum oxide may include alcohol (e.g. isopropanol) as oxidizing precursors.

The cycle (as illustrated according to view 910 to 970) may be repeated until a desired thickness of layer 318 including aluminum oxide may be obtained.

Various embodiments provide a protective layer including aluminum oxide, for copper. Aluminum oxide layer 318, e.g. amorphous aluminum oxide, may be stable against environmental influences, e.g. heating, and sufficiently sealed against moisture. Even with heating up to 300° C., layer 318 including aluminum oxide may remain stable over copper pad 302, without degrading. Furthermore, the formation of copper oxide may be prevented.

Layer 318 including aluminum oxide may be deposited using ALD thereby producing an excellent conformal coating over metal structures, e.g. metallization structure 302. Layer 318 including aluminum oxide may provide excellent copper protection against oxidation. Furthermore, depositing layer 318 including aluminum oxide using ALD may remove initial metal oxide layers, e.g. copper oxide, during the first cycle of the aluminum precursor. Layer 318 including aluminum oxide may provide excellent protection against electrochemistry and therefore no dendrite growth. Layer 318 including aluminum oxide may provide excellent cost of ownership (CoO), meaning deposition may be cheap, using only very thin aluminum oxide layers, e.g. about 5 nm, or using e.g. a batch process, for example by deposition in a vertical furnace. Layer 318 including aluminum oxide may also be used to protect other metal surfaces and may be deposited on almost every material.

Various embodiments provide a semiconductor device, including: a final metal layer, having a top side and at least one sidewall; and a passivation layer disposed over at least part of at least one of the top side and the at least one sidewall of the final metal layer; wherein the passivation layer has a substantially uniform thickness.

According to an embodiment, the semiconductor device may include a wafer substrate.

According to an embodiment, the passivation layer is disposed over part of the top side of the final metal layer.

According to an embodiment, the passivation layer is disposed over the entire top side of the final metal layer.

According to an embodiment, the passivation layer is disposed over part of the at least one sidewall of the final metal layer.

According to an embodiment, the passivation layer is disposed over the entire sidewall or sidewalls of the final metal layer.

According to an embodiment, the passivation layer is disposed over the top side and the at least one sidewall of the final metal layer.

According to an embodiment, the passivation layer encapsulates the final metal layer.

According to an embodiment, the passivation layer is formed by an atomic layer deposition process.

According to an embodiment, the thickness of the passivation layer is less than or equal to about 100 nm, e.g. less than or equal to about 50 nm, e.g. less than or equal to about 20 nm, e.g. less than or equal to about 10 nm, e.g. less than or equal to about 5 nm, e.g. in the range from about 1 nm to about 100 nm, e.g. in the range from about 1 nm to about 50 nm, e.g. in the range from about 1 nm to about 20 nm, e.g. in the range from about 5 nm to about 20 nm, e.g. in the range from about 1 nm to about 10 nm, e.g. in the range from about 5 nm to about 10 nm, e.g. in the range from about 1 nm to about 5 nm.

According to an embodiment, the passivation layer includes or consists of a metal oxide.

According to an embodiment, the metal oxide is an oxide, which is different from a native oxide of the material of the final metal layer. For example, according to an embodiment, the final metal layer may include or consist of a metal "X" (e.g. copper), and the passivation layer may include or consist of a metal oxide, which is different from a native oxide of "X".

According to an embodiment, the passivation layer includes or consists of aluminum oxide.

According to an embodiment, the final metal layer includes or consists of at least one metal from the following group of metals, the group of metals consisting of: copper, silver, palladium, silver, tungsten, aluminum and tin.

According to an embodiment, the final metal layer includes or consists of copper.

According to an embodiment, the final metal layer includes or consists of aluminum.

According to an embodiment, the passivation layer is a first passivation layer and the semiconductor device further includes a second passivation layer at least partially surrounding the first passivation layer.

According to an embodiment, the second passivation layer includes or consists of at least one material from the following group of materials, the group of materials consisting of: polyimide, epoxy, polymer, silicon dioxide, silicon nitride, silicon oxinitride.

According to an embodiment, the semiconductor device includes a hole formed through at least one of the first passivation layer and the second passivation layer.

According to an embodiment, the hole is formed through the first passivation layer and the second passivation layer.

According to an embodiment, the hole is formed through the second passivation layer but not through the first passivation layer.

According to an embodiment, the semiconductor device further includes an interconnect structure formed through the hole and electrically connected to the final metal layer.

According to an embodiment, the interconnect structure includes an electrically conductive wire.

According to an embodiment, the hole is formed through the first passivation layer and the second passivation layer; and the interconnect structure is electrically connected to the final metal layer through the hole formed through the first passivation layer and the second passivation layer.

According to an embodiment, the hole is formed through the second passivation layer; and the interconnect structure is electrically connected to the final metal layer via the first passivation layer.

Various embodiments provide a method for processing a semiconductor device, including: forming a final metal layer having a top side and at least one sidewall; and forming a passivation layer over at least part of at least one of the top side and the at least one sidewall of the final metal layer by means of an atomic layer deposition process.

According to an embodiment, forming the passivation layer over at least part of at least one of the top side and the at least one sidewall of the final metal layer includes forming the passivation layer over part of the top side of the final metal layer.

According to an embodiment, forming the passivation layer over at least part of at least one of the top side and the at least one sidewall of the final metal layer includes forming the passivation layer over the entire top side of the final metal layer.

According to an embodiment, forming the passivation layer over at least part of at least one of the top side and the at least one sidewall of the final metal layer includes forming the passivation layer over part of the at least one sidewall of the final metal layer.

According to an embodiment, forming the passivation layer over at least part of at least one of the top side and the at least one sidewall of the final metal layer includes forming the passivation layer over the entire sidewall or sidewalls of the final metal layer.

According to an embodiment, forming the passivation layer over at least part of at least one of the top side and the at least one sidewall of the final metal layer includes conformally forming the passivation layer over the top side and the at least one sidewall of the final metal layer.

According to an embodiment, forming the passivation layer over at least part of at least one of the top side and the at least one sidewall of the final metal layer includes encapsulating the final metal layer with the passivation layer.

According to an embodiment, the passivation layer includes or consists of a metal oxide.

According to an embodiment, the metal oxide is an oxide, which is different from a native oxide of the material of the final metal layer. For example, according to an embodiment, the final metal layer may include or consist of a metal "X" (e.g., copper), and the passivation layer may include or consist of a metal oxide, which is different from a native oxide of "X".

According to an embodiment, the passivation layer includes or consists of aluminum oxide.

According to an embodiment, the atomic layer deposition process includes an aluminum precursor comprising trimethylaluminum.

According to an embodiment, the atomic layer deposition process includes at least one oxidizing precursor from the following group of oxidizing precursors, the group of oxidizing precursors consisting of: water, alcohol, isopropanol, ethanol and methanol.

According to an embodiment, the final metal layer includes at least one metal from the following group of metals, the group of metals consisting of: copper, silver, palladium, silver, tungsten, aluminum and tin.

According to an embodiment, the passivation layer is a first passivation layer and the method further includes at least partially surrounding the first passivation layer with a second passivation layer.

According to an embodiment, the second passivation layer includes or consists of at least one material from the following group of materials, the group of materials consisting of: polyimide, epoxy, polymer, silicon dioxide, silicon nitride, silicon oxinitride.

According to an embodiment, the method further includes forming a hole through at least one of the first passivation layer and the second passivation layer; forming an interconnect structure through the hole; and electrically connecting the interconnect structure to the final metal layer.

According to an embodiment, forming a hole through at least one of the first passivation layer and the second passivation layer includes forming the hole through the first passivation layer and the second passivation layer; and electrically connecting the interconnect structure to the final metal layer includes electrically connecting the interconnect structure to the final metal layer through the hole.

According to an embodiment, forming a hole through at least one of the first passivation layer and the second passivation layer includes forming the hole through the second passivation layer but not through the first passivation layer; and electrically connecting the interconnect structure to the final metal layer includes electrically connecting the interconnect structure to the final metal layer through the hole and via the first passivation layer.

Various embodiments provide a metallization structure arrangement, including a semiconductor carrier including a metallization structure formed over a surface of the semiconductor carrier; and a layer including aluminum oxide disposed over at least a part of the metallization structure.

According to an embodiment, the metallization structure arrangement further includes a passivation layer at least partially surrounding the layer including aluminum oxide.

According to an embodiment, the semiconductor carrier includes a semiconductor chip.

According to an embodiment, the surface is a top surface of the semiconductor chip.

According to an embodiment, the surface is a bottom surface of the semiconductor chip.

According to an embodiment, the layer including aluminum oxide is formed conformally over at least one surface of the metallization structure.

According to an embodiment, the layer including aluminum oxide encapsulates the metallization structure.

According to an embodiment, the layer including aluminum oxide has a thickness of less than or equal to about 100 nm, e.g. less than or equal to about 50 nm, e.g. less than or equal to about 20 nm, e.g. less than or equal to about 10 nm, e.g. less than or equal to about 5 nm, e.g. in the range from about 1 nm to about 100 nm, e.g. in the range from about 1 nm to about 50 nm, e.g. in the range from about 1 nm to about 20 nm, e.g. in the range from about 5 nm to about 20 nm, e.g. in the range from about 1 nm to about 10 nm, e.g. in the range from about 5 nm to about 10 nm, e.g. in the range from about 1 nm to about 5 nm.

According to an embodiment, the metallization structure includes a metal contact pad.

According to an embodiment, the metallization structure includes a top surface and one or more side walls, wherein the aluminum oxide layer covers at least one of the top surface and the one or more side walls.

According to an embodiment, the passivation layer includes at least one material from the following group of materials, the group of materials consisting of: polyimide, epoxy, polymer, silicon dioxide, silicon nitride, silicon oxinitride.

According to an embodiment, the metallization structure arrangement further includes an interconnect structure formed through a hole in at least one of the passivation layer and the layer including aluminum oxide, wherein the interconnect structure is electrically connected to the metallization structure.

According to an embodiment, the interconnect structure includes an electrically conductive wire.

According to an embodiment, the interconnect structure includes a wire bond structure wherein the wire bond structure is bonded to the metallization structure.

According to an embodiment, the wire bond structure includes at least one of a ball bond and a wedge bond.

According to an embodiment, the interconnect structure is electrically connected to the metallization structure through a hole formed through the passivation layer and the layer including aluminum oxide.

According to an embodiment, the passivation layer includes a hole over the layer including aluminum oxide, wherein the interconnect structure is electrically connected to the metallization structure via the layer including aluminum oxide.

According to an embodiment, the metallization structure comprises at least one metal from the following group of metals, the group of metals consisting of: copper, silver, palladium, silver, tungsten, aluminum and tin.

According to an embodiment, the metallization structure comprises copper.

According to an embodiment, the metallization structure comprises aluminum.

Various embodiments provide a semiconductor chip arrangement, including a semiconductor chip including a metallization structure formed over a surface of the semiconductor chip; an aluminum oxide layer disposed over the metallization structure; and a passivation layer at least partially disposed over the metallization structure.

According to an embodiment, the aluminum oxide layer covers a top surface and one or more side walls of the metallization structure.

According to an embodiment, the aluminum oxide layer is formed conformally over at least one surface of the metallization structure.

According to an embodiment, the aluminum oxide layer is arranged such that formation of a metal oxide at a surface of the metallization structure is prevented.

According to an embodiment, the aluminum oxide layer is arranged such that at least one of contamination and corrosion at a surface of the metallization structure is prevented.

According to an embodiment, the aluminum oxide layer is arranged such that growth of additional structures from the metallization structure is prevented.

Various embodiments provide a method for manufacturing a metallization structure arrangement, the method including disposing a layer including aluminum oxide over a metallization structure, the metallization structure being disposed over a surface of a semiconductor carrier.

According to an embodiment, the method further includes at least partially surrounding the layer including aluminum oxide with a passivation layer.

According to an embodiment, disposing a layer including aluminum oxide over a metallization structure includes covering at least one of a top surface and one or more side walls of the metallization structure with aluminum oxide.

According to an embodiment, disposing a layer including aluminum oxide over a metallization structure includes disposing the layer including aluminum oxide by an atomic layer deposition process.

According to an embodiment, disposing the layer including aluminum oxide by atomic layer deposition includes forming the layer including aluminum oxide conformally over at least one surface of the metallization structure.

According to an embodiment, disposing an aluminum oxide layer over a metal pad of a chip includes forming a chemical reaction at at least one surface of the metallization structure to remove metal oxides from the metallization structure.

According to an embodiment, the method further includes forming a hole through at least one of the passivation layer and the layer including aluminum oxide; and forming an interconnect structure through the hole thereby electrically connecting the interconnect structure to the metallization structure.

According to an embodiment, the atomic layer deposition process includes an aluminum precursor including trimethylaluminum.

According to an embodiment, the atomic layer deposition process includes at least one oxidizing precursor from the following group of oxidizing precursors, the group of oxidizing precursors consisting of: water, alcohol, isopropanol, ethanol and methanol.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a semiconductor device, comprising:
   forming a final metal layer having a top side and at least one sidewall;
   forming, by an atomic layer deposition process, a passivation layer over at least part of at least one the top side of the final metal layer so that the passivation layer completely covers the top side of the final metal layer;
   forming a second passivation layer to at least partially surrounding the passivation layer, wherein the second passivation layer completely covers a top side of the passivation layer;
   forming a first hole through the second passivation layer so that a portion of the top side of the passivation layer is exposed;
   forming an interconnect structure through or in the first hole;
   electrically connecting the interconnect structure to the final metal layer, wherein electrically connecting the interconnect structure to the final metal layer further comprises,
      bonding the interconnect structure to the final metal layer so that that the bonding process breaks through the passivation layer so that the interconnect structure is electrically connected to the final metal layer,
   wherein the interconnect comprises an electrically conductive wire and a wire bond structure, the wire bond structure physically contacting a top side of the final metal layer.

2. The method of claim 1, further comprising:
   forming the passivation layer over at least one sidewall of the final metal layer.

3. The method of claim 1, wherein the passivation layer is conformally formed over the top side and the at least one sidewall of the final metal layer.

4. The method of claim 1,
   wherein the passivation layer comprises a metal oxide.

5. The method of claim 4,
   wherein the metal oxide is an oxide, which is different from a native oxide of the final metal layer.

6. The method of claim 1,
   wherein the passivation layer comprises aluminum oxide.

7. The method of claim 1,
   wherein the atomic layer deposition process comprises an aluminum precursor comprising trimethylaluminum.

8. The method of claim 1,
   wherein the atomic layer deposition process comprises at least one oxidizing precursor from the following group of oxidizing precursors, the group of oxidizing precursors consisting of: water, alcohol, isopropanol, ethanol and methanol.

9. The method of claim 1,
   wherein the final metal layer comprises at least one metal from the following group of metals, the group of metals consisting of: copper, silver, palladium, silver, tungsten, aluminum and tin.

10. The method of claim 1,
    wherein the second passivation layer comprises at least one material from the following group of materials, the group of materials consisting of: polyimide, epoxy, polymer, silicon dioxide, silicon nitride, silicon oxinitride.

11. The method of claim 1, further comprising:
    wherein the bonding process breaks through the passivation layer so as to form a second hole through the passivation layer, wherein a third hole comprises the first and second holes.

12. The method of claim 1, wherein a thickness of the passivation measured from the top side of the final metal layer is in a range of 5 nm to 10 nm.

13. A method for forming a metallization structure arrangement, comprising
    providing a semiconductor chip;
    forming a metal contact pad directly on a top or bottom surface of the semiconductor chip, wherein the metal contact pad comprises a plurality of layers including a final metal layer and wherein, the final metal layer comprising copper and is a layer of the contact pad furthest from the semiconductor chip;
    forming an aluminum oxide layer directly on the metal contact pad so that the aluminum oxide layer conformally covers at least an entire top surface of the metal contact pad and at least a portion of one or more sidewalls of the final metal layer; and
    forming a passivation layer that at least partially surrounds the aluminum oxide layer, wherein the passivation layer completely covers a top side of the aluminum oxide layer;
    forming a first hole through the passivation layer so that a portion of the top side of the aluminum oxide layer is exposed;
    forming an interconnect structure through or in the first hole; and
    electrically connecting the interconnect structure to the final metal layer, wherein electrically connecting the interconnect structure to the final metal layer further comprises,
       bonding the interconnect structure to the final metal layer so that that the bonding process breaks through the aluminum oxide layer so that the interconnect structure is electrically connected to the final metal layer,
    wherein the interconnect comprises an electrically conductive wire and a wire bond structure, the wire bond structure physically contacting a top side of the final metal layer.

14. The method of claim 1, further comprising:
    wherein the bonding process breaks through the aluminum oxide layer so as to form a second hole through the aluminum oxide layer, wherein a third hole comprises the first and second holes.

15. The method of claim 1, further comprising:
    wherein the wire bond structure is a ball bond or a wedge bond.

* * * * *